United States Patent [19]

Nakajima et al.

[11] Patent Number: 5,710,606
[45] Date of Patent: Jan. 20, 1998

[54] LCD TFT HAVING TWO LAYER REGION ADJACENT BASE REGION IN WHICH THE LAYERS HAVE OPPOSITE CONDUCTIVITIES AND HAVE TWO DENSITY GRADIENTS

[75] Inventors: Mitsuo Nakajima, Koshigaya; Yoshito Kawakyu, Kawasaki, both of Japan

[73] Assignee: Kabushiki Kaisha Toshiba, Kawasaki, Japan

[21] Appl. No.: 517,635

[22] Filed: Aug. 22, 1995

[30] Foreign Application Priority Data

Aug. 24, 1994 [JP] Japan .................... 6-199265

[51] Int. Cl.⁶ .................... G02F 1/136; G02F 1/1345; H01L 29/04; H01L 27/01
[52] U.S. Cl. .................... 349/42; 349/151; 257/59; 257/72; 257/349
[58] Field of Search .................... 359/59; 257/72, 257/59, 349, 57, 61, 191, 335, 336, 408; 437/29; 349/42, 151

[56] References Cited

U.S. PATENT DOCUMENTS

| 4,764,477 | 8/1988 | Chang et al. | 437/29 |
|---|---|---|---|
| 5,412,493 | 5/1995 | Kunii et al. | 257/72 |
| 5,530,266 | 6/1996 | Yonehara et al. | 359/59 |
| 5,574,292 | 11/1996 | Takahashi et al. | 349/42 |

FOREIGN PATENT DOCUMENTS

| 60-154660 | 8/1985 | Japan . | |
|---|---|---|---|
| 1-37055 | 2/1989 | Japan | 257/408 |
| 1-208869 | 8/1989 | Japan | 257/336 |
| WO 88/08202 | 10/1988 | WIPO | 257/349 |

*Primary Examiner*—William L. Sikes
*Assistant Examiner*—Walter J. Malinowski
*Attorney, Agent, or Firm*—Oblon, Spivak, McClelland, Maier & Neustadt, P.C.

[57] ABSTRACT

A polycrystalline silicon active layer is provided on a transparent insulating substrate. Phosphorus is ion-implanted into the active layer, to form a pair of n-type source/drain regions with a base region interposed therebetween. In this ion-implantation, a density gradient of phosphorus is formed in the thicknesses direction of the active layer. Boron is ion-implanted into each of the source/drain regions, to be adjacent to the base region. In this ion-implantation, a density gradient of boron is formed, and the position providing a maximum density of boron is set to be deeper than the position which provides a maximum density of phosphorus. By the ion-implantation of boron, an n-type LDD portion having a high resistance and a p-type portion are formed on the upper and lower sides, respectively, adjacent to the base region within each of the source/drain regions.

17 Claims, 4 Drawing Sheets

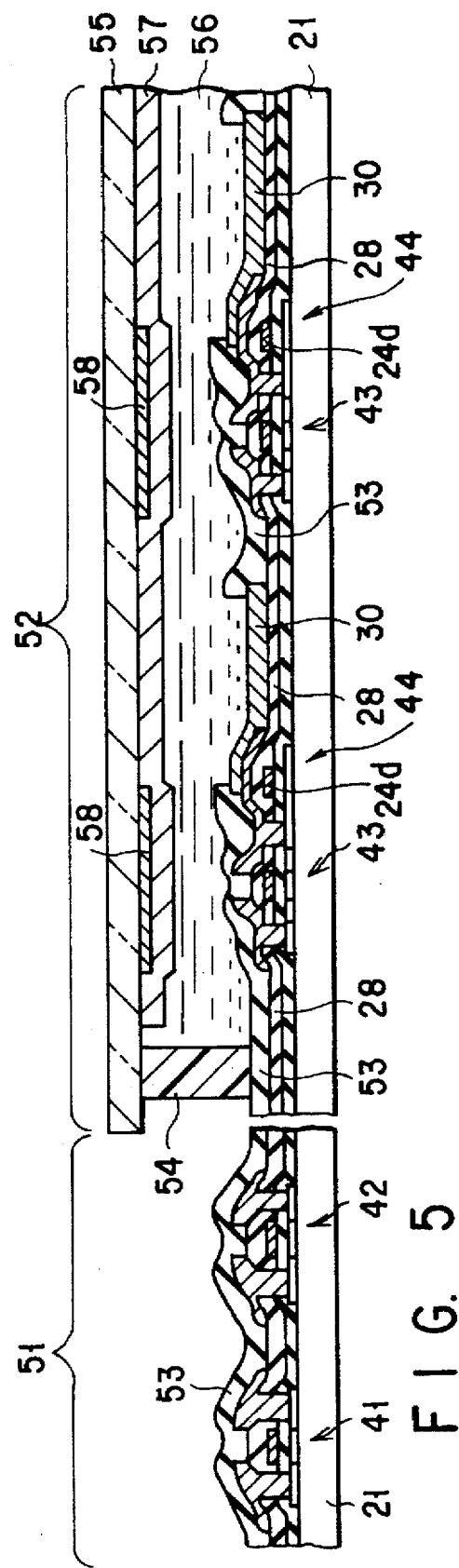
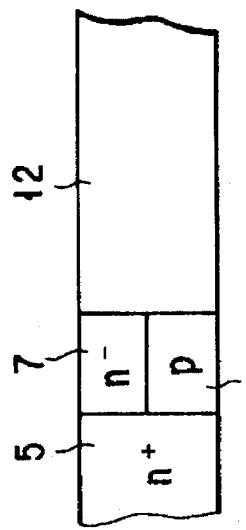
FIG. 2
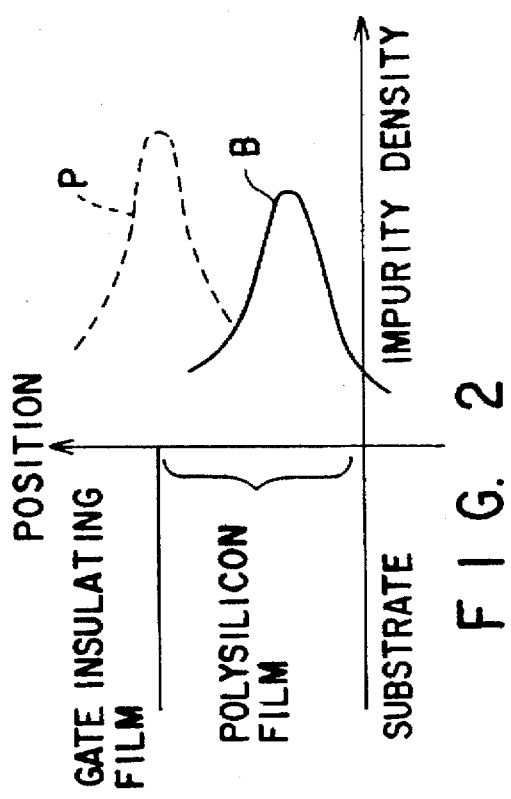
FIG. 3
FIG. 5

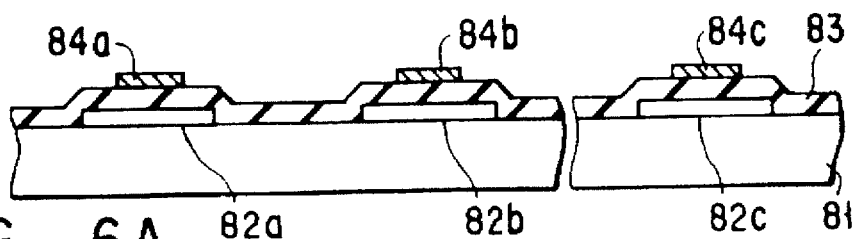
F I G. 6A *PRIOR ART*
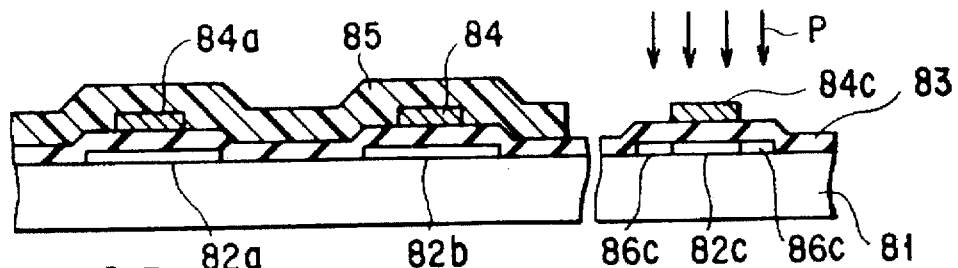
F I G. 6B *PRIOR ART*
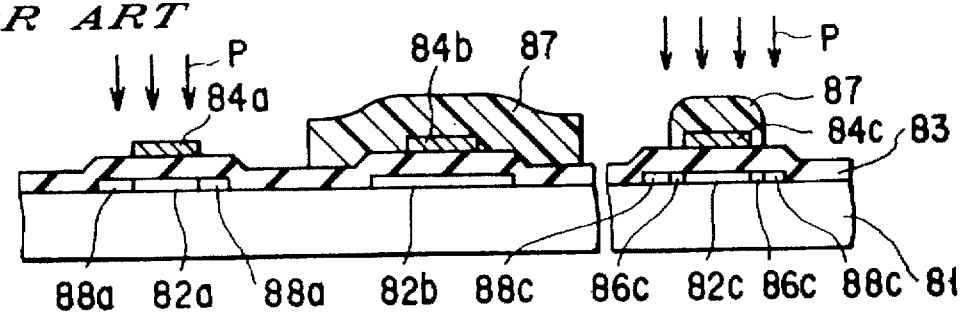
F I G. 6C *PRIOR ART*
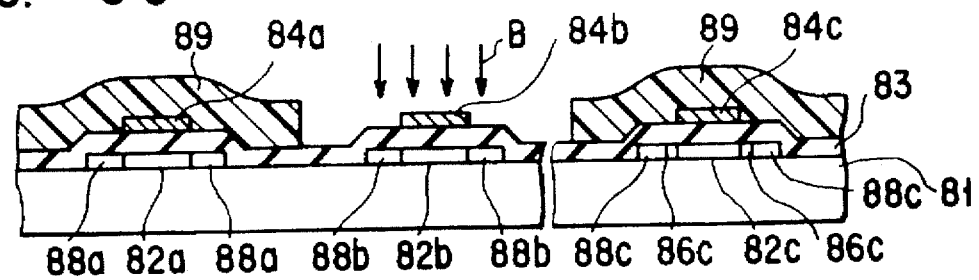
F I G. 6D *PRIOR ART*
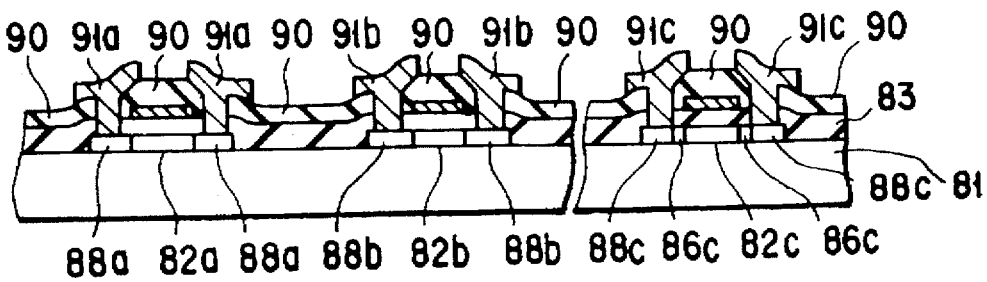
F I G. 6E *PRIOR ART*

LCD TFT HAVING TWO LAYER REGION ADJACENT BASE REGION IN WHICH THE LAYERS HAVE OPPOSITE CONDUCTIVITIES AND HAVE TWO DENSITY GRADIENTS

BACKGROUND OF THE INVENTION

1. Field of the Invention

The present invention relates to a thin film transistor (TFT) having a lightly doped drain (LDD) structure, and a semiconductor device and a liquid crystal display device each using the transistor.

2. Description of the Related Art

A liquid crystal display device such as an active matrix type liquid crystal display device or the like is characterized by its thinness, light weight, and ability of low voltage driving, and further can easily realize color display. For this reason, liquid crystal display devices have been used as display devices for personal computers, word processors, and the likes, in recent years.

Especially, a kind of liquid crystal display device using TFTs as switching elements for pixels ensures high display quality and low power consumption. Studies and developments have been eagerly made with respect to this kind of display device. Based on materials forming active layers, TFTs are roughly classified into two kinds, one being an amorphous silicon TFT using amorphous silicon as a material of its active layer, and the other being a polycrystalline silicon TFT using polycrystalline silicon as a material of its active layer.

A polycrystalline silicon TFT is advantageous in that its degree of movement is as 10 to 100 times high as an amorphous silicon TFT. Therefore, a polycrystalline silicon TFT can be used for a pixel switching element. In addition, polycrystalline silicon TFTs have been used as components of peripheral driving circuits in recent years, and as a result, studies and developments have actively been made to simultaneously form TFTs for pixels and TFTs for peripheral circuits on one single substrate, i.e., to form a liquid crystal display device in which a pixel area and a driving circuit area are integrally formed.

However, there is a problem that an OFF current (i.e., a leakage current which flows when a TFT is OFF) of a polycrystalline silicon TFT is higher than that of an amorphous silicon TFT. Such a high OFF current does not cause difficulties as long as a TFT is used in a peripheral circuit, but cause a problem of degradation in image quality when the TFT is used as a pixel switching element. It has been considered that an LDD structure should be adopted in a polycrystalline silicon TFT used in a pixel area to solve this problem.

FIGS. 6A to 6E show steps in a method of manufacturing the array substrate of a liquid crystal display device which uses polycrystalline silicon TFTs having an LDD structure as TFTs in a pixel area and in which the pixel area and peripheral drive circuits are integrally formed. Here, only a CMOS transistor is indicated as a component of the peripheral drive circuit. The polycrystalline silicon TFT in the pixel area has a conductivity of n-type.

At first, as shown in FIG. 6A, a polycrystalline silicon film is formed on a transparent insulating substrate 81, and thereafter, the polycrystalline silicon film is subjected to patterning to form active layers 82a to 82c. Then, a gate insulating film 83 is formed on the entire surface, and further, gate electrodes 84a to 84c are formed on the gate insulating film 83.

Next, as shown in FIG. 6B, ion-implantation of phosphorus (P) having a relatively low dose amount is performed on a portion where TFTs of the pixel area are to be formed, with the CMOS of the peripheral drive circuit area being covered with a resist 85. As a result of this, n⁻-type source/drain regions 86c having a low density are formed by self-alignment with the gate electrode 84c.

Further, as shown in FIG. 6C, the resist 85 is removed, and thereafter, a portion of the peripheral drive circuit area where p-type TFTs are to be formed, the gate electrode 84c of the pixel area, and that portion of the n⁻-type source/drain regions 86c which is close to the gate electrodes are covered with a resist 87. Under this condition, ion-implantation of P having a relatively high dose amount is carried out. As a result, n⁺-type source/drain regions 88a and 88c having a high density are formed.

In the next, as shown in FIG. 6D, the resist 87 is removed, and thereafter, a portion of the peripheral drive circuit area where n-type TFTs are to be formed and a portion of the pixel area where TFTs are to be formed are covered with a resist 89. Under this condition, ion-implantation of boron (B) having a relatively high dose amount is performed on a portion of the drive circuit where p-type TFTs are to be formed. As a result, a p⁺-type source/drain region 88b having a high density is formed.

Further, as shown in FIG. 6E, the resist 89 is removed, and thereafter, thermal activation of impurities, formation of an interlevel insulating film 90, and formation of source/drain electrodes 91a to 91c are sequentially performed, to complete a basic structure of each TFT. Thereafter, pixel electrodes (not shown) are formed, thus completing a basic structure of the array substrate.

However, in case of a TFT having this LDD structure, the source/drain regions become large due to the n⁻-type source/drain regions 86c having a low density, and therefore, it is difficult to improve the opening rate of pixels.

Also, in the above manufacturing method, a photolithography step and an ion-implantation step are required for each of the steps shown in FIGS. 6B, 6C, and 6D, in order to form source/drain regions for an LDD structure of TFTs of the pixel area and normal source/drain regions for TFTs of the peripheral drive circuit area. Specifically, at least three photolithography steps and at least three ion-implantation steps are required. Thus, if an LDD structure is introduced into TFTs of the pixel area in order to prevent a leakage current, processing steps are increased or complicated in comparison with normal TFTs having no LDD structure. This results in a problem that the manufacturing yield and through-put are lowered.

SUMMARY OF THE INVENTION

The present invention has an object of providing a thin film transistor having an LDD structure improved in comparison with a conventional LDD structure, and a semiconductor device and a liquid crystal display device using the thin film transistor.

According to a first aspect of the present invention, there is provided a thin-film transistor comprising:

an insulating substrate;

a semiconductor active layer provided on the substrate;

a base region formed in the active layer;

first impurities of a first conductivity type ion-implanted into the active layer on both sides interposing the base region, the first impurities having a density gradient in a thickness direction of the active layer, wherein a pair of source/drain regions of the first conductivity type are formed with the first impurities in the active layer, with the base region interposed between the pair of source/drain regions;

second impurities of a second conductivity type ion-implanted into each of the source/drain regions, to be adjacent to the base region, the second impurities having a density gradient in the thickness direction of the active layer, and having a maximum density position set to be deeper than that of the first impurities, wherein first and second portions are formed with the second impurities on upper and lower sides, respectively, adjacent to the base region within each of the source/drain regions, the first portion being of the first conductivity type and having a resistance higher than the source/drain regions, the second portion being of the second conductivity type;

a gate electrode facing the base region through a gate insulating film; and source/drain electrodes respectively connected to the source/drain regions.

According to a second aspect of the present invention, there is provided a semiconductor device including first, second and third thin film transistors, comprising:

an insulating substrate;

first, second and third active layers formed from one single semiconductor film on the substrate, so as to correspond to the first, second and third thin film transistors, respectively;

first, second and third base regions respectively formed in the first, second and third active layers;

first impurities of a first conductivity type ion-implanted into the first and third active layers on both sides interposing the first and third base regions, the first impurities having a density gradient in a thickness direction of the first and third active layers, wherein a pair of first and a pair of third source/drain regions of the first conductivity type are formed with the first impurities in the first and third active layers, respectively, with the first and third base regions interposed between the pairs of first and third source/drain regions, respectively;

second impurities of a second conductivity type ion-implanted into the second active layer, on both sides interposing the second base region, and into each of the third source/drain regions, to be adjacent to the third base region, the second impurities having a density gradient in the thickness direction of the active layer, and having a maximum density position set to be deeper than that of the first impurities, wherein a pair of second source/drain regions of the second conductivity type are formed with the second impurities in the second active layer, with the second base region interposed between the pair of second source/drain regions, and wherein first and second portions are formed with the second impurities on upper and lower sides, respectively, adjacent to the third base region within each of the third source/drain regions, the first portion being of the first conductivity type and having a resistance higher than the third source/drain regions, the second portion being of the second conductivity type;

first, second and third gate electrodes respectively facing the first, second and third base regions through a gate insulating film; and first, second and third source/drain electrodes respectively connected to the first, second and third source/drain regions.

According to a third aspect of the present invention, there is provided a liquid crystal display device including first and second thin film transistors in a peripheral drive circuit and a third thin film transistor as a switching element for a pixel, comprising:

a first insulating substrate;

first, second and third active layers formed from one semiconductor film on the first substrate, so as to correspond to the first, second and third thin film transistors, respectively;

first, second and third base regions respectively formed in the first, second and third active layers;

first impurities of a first conductivity type ion-implanted into the first and third active layers on both sides interposing the first and third base regions, the first impurities having a density gradient in a thickness direction of the first and third active layers, wherein a pair of first and a pair of third source/drain regions of the first conductivity type are formed with the first impurities in the first and third active layers, respectively, with the first and third base regions interposed between the pairs of first and third source/drain regions, respectively;

second impurities of a second conductivity type ion-implanted into the second active layer, on both sides interposing the second base region, and into each of the third source/drain regions, to be adjacent to the third base region, the second impurities having a density gradient in the thickness direction of the active layer, and having a maximum density position set to be deeper than that of the first impurities, wherein a pair of second source/drain regions of the second conductivity type are formed with the second impurities in the second active layer, with the second base region interposed between the pair of second source/drain regions, and wherein first and second portions are formed with the second impurities on upper and lower sides, respectively, adjacent to the third base region within each of the third source/drain regions, the first portion being of the first conductivity type and having a resistance higher than the third source/drain regions, the second portion being of the second conductivity type;

first, second and third gate electrodes respectively facing the first, second and third base regions through a gate insulating film;

first, second and third source/drain electrodes respectively connected to the first, second and third source/drain regions;

a pixel electrode connected to one of the third source/drain electrodes;

a transparent and insulating second substrate facing the first substrate with a distance therebetween;

means, provided between the first and second substrates, for forming a sealed space surrounding the third active layer, gate electrode, source/drain electrodes, and the pixel electrode;

liquid crystal enclosed in the sealed space; and a transparent counter electrode facing the pixel electrode through the liquid crystal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a graph showing an impurity density profiles of p-type impurities (boron) and n-type impurities (phosphorus) of the TFT of FIGS. 1A to 1E;

FIG. 3 is an enlarged view of a part of the TFT shown in FIGS. 1A to 1E;

FIG. 5 is a cross-section showing a part of the liquid crystal display device manufactured in accordance with the manufacturing method shown in FIGS. 4A to 4E; and FIGS. 6A to 6E are cross-sections showing a manufacturing method of a conventional liquid crystal display device in the order of its processing steps.

DETAILED DESCRIPTION OF THE PREFERRED EMBODIMENTS

FIGS. 1A to 1E show a method of manufacturing a co-planar type TFT according to the embodiment of the present invention.

Figure 1A:
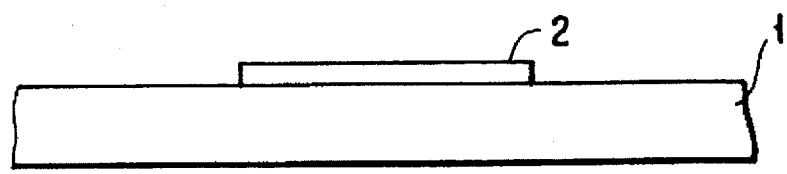
FIGS. 1A to 1E are cross-sections showing the manufacturing method of a TFT in the order of its processing steps, according to an embodiment of the present invention.

At first, as shown in FIG. 1A, a polycrystalline silicon film 2 as an active layer is formed in a predetermined shape. As an insulating substrate, for example, a transparent substrate made of an insulating material such as glass or the like or a substrate whose surface is coated with an insulating material is used.

The film thickness of the polycrystalline silicon film 2 is 50 nm to 80 nm, for example. As a method of forming the polycrystalline silicon film 2, the following three methods may be cited for example. One is a method of forming a polycrystalline silicon film from an amorphous silicon film by solid phase crystallization. Another is a method of firstly forming an amorphous silicon film by a plasma CVD method or an LPCVD method, and then crystallizing the amorphous silicon film by laser annealing. Further, another is a method of directly forming a polycrystalline silicon film by a plasma CVD method using $SiH_4$, $SiF_4$, and $H_2$ as material gases.

Figure 1B:
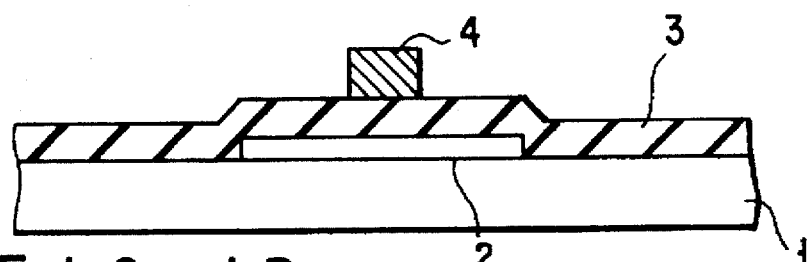

Next, as shown in FIG. 1B, a gate insulating film 3 is formed on the entire surface, and thereafter, a gate electrode 4 is formed on the insulating film 3. As the gate insulating film 3, for example, a silicon oxide film or a silicon nitride film is used. The film thickness of the gate insulating film 3 is, for example, 70 nm to 100 nm. As a film formation method for the gate insulating film 3, for example, a CVD method, a plasma CVD method, or an ECR-CVD method is used. Otherwise, a thermally oxidized polycrystalline silicon film may be used as the gate insulating film 3.

The film thickness of the gate electrode 4 is 250 nm, for example. The material of the gate electrode 4 may be, for example, a metal such as Al, W, Mo, or Ta, an alloy of them, silicide, polycrystalline silicon doped with impurities, or polycrystalline silicon formed by subjecting amorphous silicon to laser annealing.

Figure 1C:
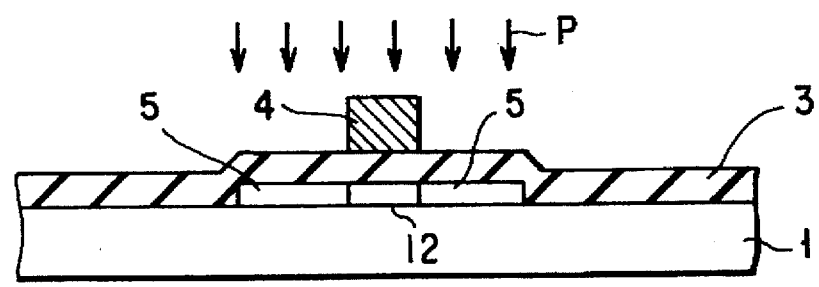

Next, as shown in FIG. 1C, phosphorus (P) as n-type impurities is ion-implanted into the polycrystalline silicon film 2 at a dose amount of, e.g., $5 \times 10^{15}$ $cm^{-2}$, to form two $n^+$-type source/drain regions 5 having a high density, with a gate electrode 4 used as a mask. This ion-implantation is performed such that the impurity density profile has a maximum impurity density in the depth direction, as shown in FIG. 2. The portion positioned in the center of the polycrystalline silicon film 2 and interposed between the $n^+$-type source/drain regions 5 constitutes a base region 12 made of an intrinsic semiconductor.

The term of "source/drain region" described means either one or both of a source region and a drain region. This term is used because both of these two regions 5 and 5 are substantially equivalent to each other, and the source and drain regions alternately exchange their functions with each other at a high frequency, in several types of devices.

Figure 1D:
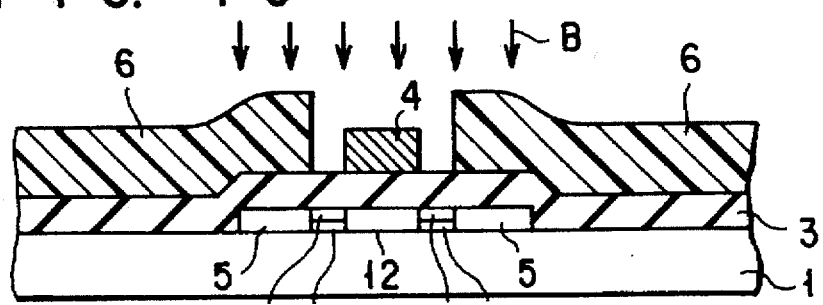

In the next, as shown in FIG. 1D, a resist 6 is covered over the $n^+$-type source/drain regions 5 except for the periphery of the gate electrode 4. Further, in this condition, boron (B) as p-type impurities is selectively ion-implanted into the source/drain regions 5 close to the gate electrode 4 at a dose amount of, e.g., $1 \times 10^{15}$ $cm^{-2}$. This ion-implantation is performed such that the impurity density profile has a maximum impurity density in the depth direction at a position deeper than that of the impurity density profile of phosphorus, as shown in FIG. 2.

As a result of this, shallow $n^-$ portions which have a higher resistance than the $n^+$-type source/drain regions 5, i.e., LDD portions 7 are formed in the surface, as shown in FIG. 3. Specifically, an upper portion of the $n^+$-type source/drain region 5 close to the gate electrode 4 changes into the LDD portion 7, while a lower portion of the $n^+$-type source/drain region 5 close to the gate electrode 4 changes into a p-type portion 9.

Next, the resist 6 is removed, and thereafter, annealing of the impurities (P, B) is performed by means of energy beams such as a laser beams, electron beams, or the likes. The annealing using energy beams is completed in a short time period, thereby preventing a problem that the impurity density profile changes. Further, if a glass substrate of low costs is used as the insulating substrate 1 to reduce costs, the glass substrate is not thermally damaged.

Figure 1E:
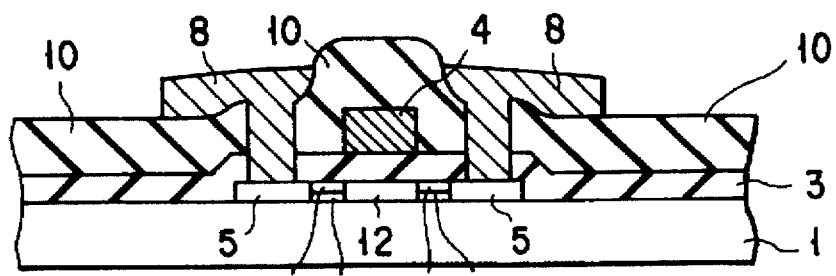

In the next, as shown in FIG. 1E, an interlevel insulating film 10 is formed on the entire surface, and thereafter, a gate insulating film 3 and an interlevel insulating film 10 on each $n^+$-type source/drain region 5 are removed by etching, to open a contact hole to the $n^+$-type source/drain region 5. Finally, an electrically conductive film is formed on the entire surface, and thereafter, this conductive film is subjected to patterning, thereby to form a source/drain electrodes 8. A basic structure of a co-planar type TFT is thus completed.

According to this embodiment, a path which allows a leakage current to pass between the two source/drain regions 5 positioned one of either side of the base region 12 is much shallower than these source/drain regions 5, and is, for example, defined by LDD portions 7 which are as half deep as the regions 5. This is because the p-type portions 9 respectively exist below the LDD portions 7, and function as a block preventing the leakage current. More specifically, both p-type portions 9 constitute PN-junctions in combination with the $n^+$-type source/drain regions 5. Therefore, either one of the PN-junctions must always be a block against the leakage current, depending on the direction of the voltage between the two source/drain regions 5. In particular, when the two regions 5 alternately exchange their functions as a source and a drain with each other at a high frequency, the path of the leakage is substantially defined by only the LDD portions 7 in the surface of the polycrystalline silicon film 2.

Thus, since the LDD portions 7 are shallow and since the path allowing a leakage current to flow has a small cross-sectional area, a sufficient resistance can be obtained against the leakage current, even when each LDD portion 7 has a small length. To simply explain, this feature complies with a known formula R=ρl/S (where R is a resistance, ρ is a proportional constant, l is a length, and S is a cross-sectional area).

Therefore, the length of the LDD portions can be reduced, so that the size of the entire TFT can be reduced to be small. Specifically, if this TFT is used as a switching element in the pixel area of a liquid crystal display device, the opening rate for pixel electrodes can be increased. As for another aspect than the prevention of leakage currents, the LDD portions 7 which serve as a current path for ON and OFF operations are shallow and short, so that switching operations are achieved at a higher speed in comparison with a TFT having a conventional LDD structure.

Although explanation has been made with respect to a co-planar type TFT in the above embodiment, the present invention is applicable to a stagger type TFT and a reverse stagger type TFT. Further, where the threshold of the TFT should be adjusted, the intrinsic semiconductor of the base region 12 may be doped with n-type or p-type impurities in a small amount.

FIGS. 4A to 4E show a manufacturing method in the order of its processing steps, wherein the manufacturing method shown in FIGS. 1A to 1E is adopted to simultaneously form a pixel area and a peripheral drive circuit area for a liquid crystal display device. In these figures, only the CMOS transistor is illustrated as a component of a peripheral circuit. The polycrystalline silicon TFT in the pixel area has a conductivity of n-type.

Figure 4A:
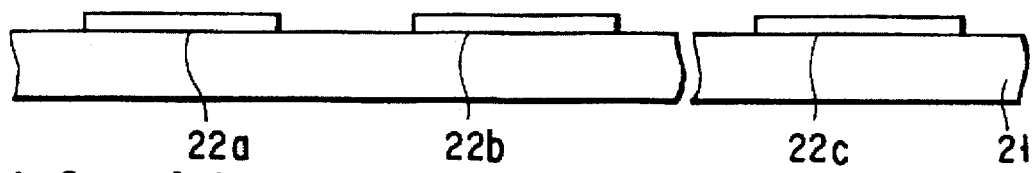
FIGS. 4A to 4E are cross-sections showing a manufacturing method in the order of its processing steps, where the manufacturing method shown in FIGS. 1A to 1E is adopted to simultaneously form a pixel area and a peripheral drive circuit area for a liquid crystal display device.

At first, as shown in FIG. 4A, polycrystalline silicon films 22a to 22c as active layers each having predetermined shapes are formed on a transparent insulating substrate 21. The material, forming method, and thickness of the polycrystalline silicon films 22a to 22c are the same as those of the polycrystalline silicon film 2 shown in FIGS. 1A to 1E.

Figure 4B:
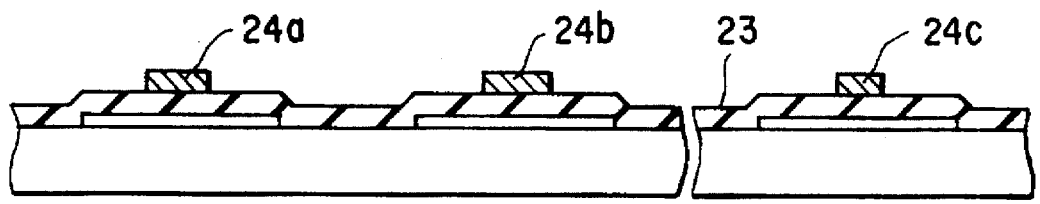

Next, as shown in FIG. 4B, a gate insulating film 23 is formed, and thereafter, gate electrodes 24a to 24c are formed on the gate insulating film 23. The material, forming method, and thickness of the gate electrodes 24a to 24c are the same as the gate electrode 4 shown in FIGS. 1A to 1E.

Figure 4C:
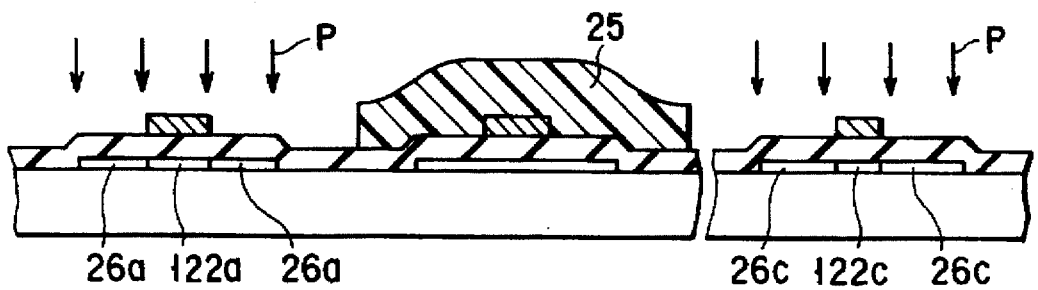

Further, as shown in FIG. 4C, a portion of the peripheral circuit area where a p-type TFT is to be formed is covered with a resist 25. Then, phosphorus (P) as n-type impurities is ion-implanted into the polycrystalline silicon films 22a and 22c at a dose amount of, e.g., $5 \times 10^{15}$ cm$^{-2}$, to form n$^+$-type source/drain regions 26a and 26c. This ion-implantation is performed such that the impurity density profile has a maximum impurity density in the depth direction, as shown in FIG. 2. The portions respectively positioned in the center of the polycrystalline silicon films 22a and 22c and respectively interposed between each two of the n$^+$-type source/drain regions 26a and 26c constitutes base regions 122a and 122c made of an intrinsic semiconductor.

Figure 4D:
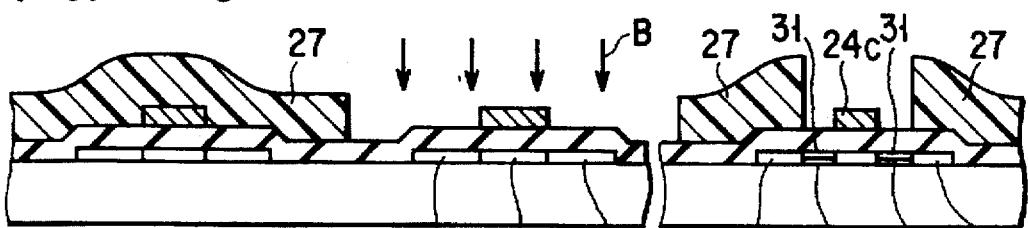

In the next, as shown in FIG. 4D, the resist 25 is removed, and thereafter, a resist 27 is applied over a portion of the peripheral drive circuit area where an n-type TFT is formed and over the n$^+$-type source/drain region 26c except for the periphery of the gate electrode 24c of the pixel area. Further, in this condition, boron (B) as p-type impurities is ion-implanted into the polycrystalline silicon films 22b and 22c, for example, at a dose amount of $1 \times 10^{15}$ cm$^{-2}$. This ion-implantation is performed such that the impurity density profile has a maximum impurity density in the depth direction at a position deeper than that of the impurity density profile of phosphorus, as shown in FIG. 2.

As a result of this, a p$^+$-type source/drain region 26b is formed. The portion positioned in the center of the polycrystalline silicon films 22b and interposed between the n$^+$-type source/drain regions 26b constitutes a base region 122b made of a intrinsic semiconductor. Further, n$^-$-type source/drain portions which have a higher resistance than the n$^+$-type source/drain regions 26c, i.e., LDD portions 31 are formed in the pixel area. Further, a p-type portion 32 like the p-type portion 9 shown in FIG. 3 is formed below each LDD portion 31 as shown in FIG. 3.

Next, the resist 27 is removed, and thereafter, annealing of the impurities (P, B) is performed by means of energy beams such as laser beams, electron beams, or the likes.

Figure 4E:
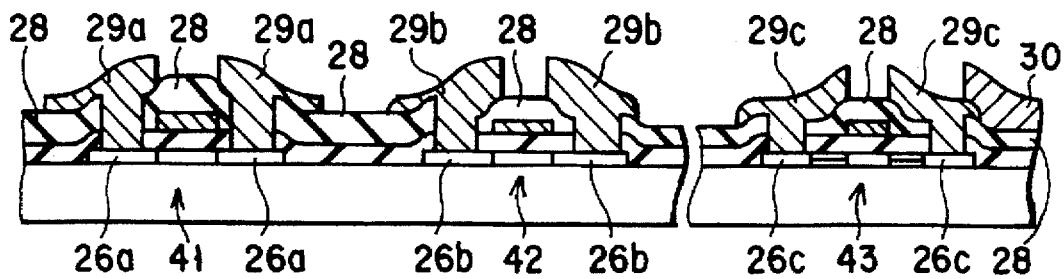

In the next, as shown in FIG. 4E, an interlevel insulating film 28 is formed on the entire surface, and thereafter, a gate insulating film 3 and an interlevel insulating film 28 on the source/drain regions 26a to 26c are removed by etching, to open contact holes to the source/drain regions 26a to 26c. Subsequently, source/drain electrodes 29a to 29c are formed by a known method, and thereafter, a transparent pixel electrode 30 made of ITO or the like is formed. Thus, a basic structure of an array substrate including an n-type TFT 41 and a p-type TFT 42 of the peripheral drive circuit area and an n-type TFT 43 of the pixel area is completed.

According to the manufacturing method shown in FIGS. 4A to 4E, the n$^+$-type source/drain regions 26a of the peripheral drive circuit area and the n$^+$-type source/drain regions 26c of the pixel area are simultaneously formed, and the p$^+$-type source/drain regions 26b of the peripheral drive circuit area and the n$^-$-type source/drain portions of the pixel area, i.e., the LDD portions 31 are simultaneously formed. Therefore, the lowermost number of times for which photolithography steps and ion-implantation steps must be performed decreases to two in comparison with the conventional method shown in FIGS. 6A to 6E in which both steps must be performed for three times. Therefore, according to the manufacturing method shown in FIGS. 4A to 4E, even if an LDD structure is introduced in a TFT of the pixel area in order to prevent leakage currents, an increase in number of processing steps and complication of processing can be restricted, so that decreases in yield and throughput as well as an increase in costs can be prevented.

Note that the structure shown in FIG. 4E can be applied not only to a liquid crystal display device, but also to a semiconductor device such as a line sensor used for a copy machine.

FIG. 5 shows a part of a liquid crystal display device manufactured in accordance with the manufacturing method shown in FIGS. 4A to 4E. Note that those components of FIG. 5 which are common to FIGS. 4A to 4E are denoted by common reference symbols, and explanation of those components will be omitted herefrom.

In this liquid crystal display device, a number of n-type TFTs 41 and p-type TFTs 42 are provided in a peripheral drive circuit area 51, and a number of n-type TFT 43 and pixel electrodes 30 are provided in a pixel area 52. However, in FIG. 5, only a pair of n-type TFT 41 and p-type TFT 42 which constitute a CMOS are illustrated in the peripheral drive circuit area 51, and only n-type TFTs 43 and pixel electrodes 30 for two pixels are illustrated in the pixel area 52.

The n-type TFT 41 and p-type TFT 42 of the peripheral drive circuit area and the n-type TFT 43 of the pixel are covered with an insulating protect film 53. The pixel electrode 30 is not covered with the insulating protect film 53.

An auxiliary capacitor 44 is connected to one of the source/drain electrodes 29c of the n-type TFT 43, which is also connected to the pixel electrode 30. The auxiliary capacitor 44 has an electrode 24d formed simultaneously with the gate electrodes 24a to 24c.

In the pixel area 52, a transparent insulating substrate 55 is provided so as to oppose a transparent insulating substrate 21. Sealing is provided between the substrates 21 and 55 by an insulating spacer 54, throughout the entire circumferences of these substrates, and liquid crystal 56 is enclosed in a closed space defined by the spacer. A transparent counter electrode 57 made of material such as ITO or the like is provided on the inner surface of the counter substrate 55. A shielding film 58 is arranged between the counter substrate 55 and counter electrode so as to correspond to each n-type TFT 43.

In the liquid crystal display device shown in FIG. 5, a TFT having a shallow and short LDD portion 7 as described with reference to FIGS. 1A to 1E and FIGS. 4A to 4E is used as a switching element of the pixel area. Therefore, an opening rate for a pixel electrode can be increased, and simultaneously, and high speed switching operation can be achieved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A thin film transistor comprising:

an insulating substrate;

a semiconductor active layer provided on said substrate;

a base region formed in said active layer having first and second laterally disposed sides and consisting essentially of a substantially intrinsic semiconductor;

first and second portions of said active layer being provided on respective said first and second sides of said base region with each portion including first impurities of a first conductivity type and second impurities of a second conductivity type, said first impurities having a first peak density position near an upper surface of the active layer and an associated first density gradient extending from the first peak density position into said active layer and said second impurities having a second peak density position that is displaced deeper into the active layer than the first peak density position and an associated second density gradient extending from the second peak density position into said active layer, wherein the first and second portions each have combined densities of said first and second impurities in an upper segment adjacent to the upper surface of the active layer having a resultant conductivity of the first type and combined densities of said first and second impurities in a lower segment of the active layer adjacent to the substrate with a resultant conductivity of the second type;

a first and a second source/drain region formed in said active layer adjacent to respective of said first and second portions on respective of said first and second sides of said base region, each said source/drain region having a conductivity of the first conductivity type and a resistance lower than a resistance of said upper segment of each of the first and second portions;

a gate insulating film over said upper surface of said active layer;

a gate electrode formed on said gate insulating film over said base region in said active layer; and first and second source/drain electrodes respectively connected to said first and second source/drain regions.

2. The thin film transistor according to claim 1, wherein said active layer consists essentially of polycrystalline silicon.

3. The thin film transistor according to claim 1, wherein said gate electrode is arranged to face said substrate through said active layer.

4. The thin film transistor according to claim 1, wherein said first and second conductivity types are respectively an n-type and a p-type.

5. A semiconductor device including first, second, and third thin film transistors, comprising:

an insulating substrate;

first, second, and third active layers formed from one single semiconductor film on said substrate, each said active layer corresponding to a respective said first, second, and third thin film transistors;

first, second, and third base regions respectively formed in said first, second, and third active layers, each said base region having lateral sides and consisting essentially of a substantially intrinsic semiconductor;

first, second, and third pairs of source/drain regions formed in respective of said first, second and third active layers;

first impurities of a first conductivity type contained in said first and third pairs of source/drain regions of the first conductivity type with each of the first and third pairs of source/drain regions being further provided on each of the lateral sides of respective of said first and third base regions, said first impurities in said first and third pairs having a peak density position near an upper surface of said first and third active layers and a density gradient extending from the peak density position into said first and third active layers;

second impurities of a second conductivity type contained in said second pair of source/drain regions in said second active layer with the second pair of source/drain regions being provided on the lateral sides of said second base region;

a combination of said first impurities and said second impurities defining separate portions in at least the third active layer between each of the source/drain regions of the third pair and an associated one of the lateral sides of the third base region, with the said first and second impurities in at least said separate portions each having a different density gradient throughout the separate portions, including a maximum density of first impurities near an upper surface of said third active layer and a maximum density of the second impurities at a position deeper into the separate portions of the third active layer as compared to the position of the maximum density of the first impurity, said different density gradients of the first and second impurities providing a first segment in each of the separate portions having both first and second impurities with a resultant conductivity of the first type and a resistance higher then that of the source/drain regions and a second segment in each of the separate portions having both first and second impurities with a resultant conductivity of the second type;

first, second, and third gate insulating films each respectively covering said first, second, and third active layers;

first, second, and third gate electrodes provide on respective of said first, second, and third gate insulating films overlying said first, second, and third base regions; and first, second, and third source/drain electrode pairs respectively connected to said first, second, and third pairs of said source/drain regions.

6. The semiconductor device according to claim 5, wherein said first, second and third active layers consist essentially of polycrystalline silicon.

7. The semiconductor device according to claim 5, wherein said first, second and third gate electrodes are arranged to face said substrate through said first, second and third active layers, respectively.

8. The semiconductor device according to claim 5, wherein said first and second conductivity types are respectively an n-type and a p-type.

9. A liquid crystal display device including first and second thin film transistors in a peripheral drive circuit and a third thin film transistor as a switching element for a pixel, comprising:

an insulating first substrate;

first, second, and third active layers formed from one single semiconductor film on said substrate, each said active layer corresponding to a respective of said first, second, and third thin film transistors;

first, second, and third base regions respectively formed in said first, second, and third active layers, each said base region having lateral sides and consisting essentially of a substantially intrinsic semiconductor;

first, second, and third pairs of source/drain regions formed in respective of said first, second and third active layers;

first impurities of a first conductivity type contained in said first and third pairs of source/drain regions of the first conductivity type provided in respective said first and third active layers with each of the first and third source/drain region pairs being further provided on each of the lateral sides of respective of said first and third base regions, said first impurities in said first and third pair having a peak density position near an upper surface of said first and third active layers and a density gradient extending from the peak density position into said first and third active layers;

second impurities of a second conductivity type contained in said second pair of source/drain regions in said second active layer with the second pair of source/drain regions being provided on the lateral sides of said second base region;

a combination of said first impurities and said second impurities defining separate portions in at least the third active layer between each of the source/drain regions of the third pair and an associated one of the lateral sides of the third base region, with the said first and second impurities in at least said separate portions each having a different density gradient throughout the separate portions including a maximum density of first impurities near an upper surface of said third active layer and a maximum density of the second impurities at a position deeper into the separate portions of the third active layer as compared to the position of the maximum density of the first impurity, said different density gradients of the first and second impurities providing a first segment in each of the separate portions having both first and second impurities with a resultant conductivity of the first type and a resistance higher than that of the source/drain regions and a second segment in each of the separate portions having both first and second impurities with a resultant conductivity of the second type;

first, second, and third gate insulating films respectively covering said first, second, and third active layers:

first, second, and third gate electrodes provided on respective of said first, second, and third gate insulating films overlying said first, second, and third base regions;

first, second, and third source/drain electrode pairs respectively connected to said first, second, and third pairs of said source/drain regions;

a pixel electrode connected to one of the pair of third source/drain electrodes;

a transparent and insulating second substrate facing said first substrate with a distance therebetween;

means, provided between the first and second substrate, for forming a sealed space surrounding the third active layer, the third gate electrode, the third pair of source/drain electrodes, and the pixel electrode;

a liquid crystal media enclosed in the sealed space; and a transparent counter electrode facing the pixel electrode through said liquid crystal media.

10. The liquid crystal display device according to claim 9, wherein said first, second and third active layers consist essentially of polycrystalline silicon.

11. The liquid crystal display device according to claim 9, wherein said first, second and third gate electrodes are arranged to face said substrate through said first, second and third active layers, respectively.

12. The liquid crystal display device according to claim 9, wherein said first and second conductivity types are respectively an n-type and a p-type.

13. The liquid crystal display device according to claim 9, wherein the first substrate is transparent.

14. A thin film transistor comprising:

an insulating substrate;

a semiconductor active layer provided on said substrate;

a base region formed in said active layer having first and second laterally disposed sides and consisting essentially of a substantially intrinsic semiconductor;

first and second portions of said active layer being provided on respective said first and second sides of said base region with each portion including first impurities of a first conductivity type and second impurities of a second conductivity type, said first impurities having a first peak density position near an upper surface of the active layer and an associated first density gradient extending from the first peak density position into said active layer and said second impurities having a second peak density position that is displaced deeper into the active layer than the first peak density position and an associated second density gradient extending from the second peak density position into said active layer, wherein the first and second portions each have combined densities of said first and second impurities in an upper segment adjacent to the upper surface of the active layer having a resultant conductivity of the first type and combined densities of said first and second impurities in a lower segment of the active layer adjacent to the substrate with a resultant conductivity of the second type;

first and second source/drain regions formed in said active layer adjacent to respective of said first and second portions on respective of said first and second sides of said base region, each said source/drain region having a conductivity of the first conductivity type;

each said upper segment having a resistance higher than a resistance of each of the source drain regions to impede leakage current flow while the lower segment conductivity of the second type blocks all leakage current flow;

a gate insulating film over said upper surface of said active layer;

a gate electrode formed on said gate insulating film over said base region in said active layer; and first and second source/drain electrodes respectively connected to said first and second source/drain regions.

15. The thin film transistor of claim 14, wherein the active layer consists essentially of polycrystalline silicone.

16. The thin film transistor of claim 14, wherein said gate electrode is arranged to face said substrate through said active layer.

17. The thin film transistor of claim 14, wherein said first and second conductivity types are n-type and p-type, respectively.

* * * * *